United States Patent
Kodama et al.

(10) Patent No.: US 11,562,836 B2
(45) Date of Patent: Jan. 24, 2023

(54) PRODUCTION METHOD FOR MGB$_2$ SUPERCONDUCTING WIRE ROD SUPERCONDUCTING COIL AND MRI

(71) Applicant: HITACHI, LTD., Tokyo (JP)

(72) Inventors: Motomune Kodama, Tokyo (JP); Shigeho Tanigawa, Tokyo (JP); Hiroshi Kotaki, Tokyo (JP); Hideki Tanaka, Tokyo (JP); Kazuya Nishi, Tokyo (JP); Takaaki Suzuki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 158 days.

(21) Appl. No.: 16/092,231

(22) PCT Filed: Mar. 10, 2017

(86) PCT No.: PCT/JP2017/009648
§ 371 (c)(1),
(2) Date: Oct. 9, 2018

(87) PCT Pub. No.: WO2017/179349
PCT Pub. Date: Oct. 19, 2017

(65) Prior Publication Data
US 2020/0090835 A1    Mar. 19, 2020

(30) Foreign Application Priority Data
Apr. 14, 2016 (JP) .............................. JP2016-080720

(51) Int. Cl.
*H01B 12/10* (2006.01)
*H01L 39/14* (2006.01)
(Continued)

(52) U.S. Cl.
CPC ......... *H01B 12/10* (2013.01); *G01R 33/3815* (2013.01); *H01F 6/005* (2013.01);
(Continued)

(58) Field of Classification Search
CPC . H01L 39/2487; H01L 39/248; H01L 39/141; H01B 12/04; H01B 12/10; Y10T 29/49014
(Continued)

(56) References Cited

U.S. PATENT DOCUMENTS

2002/0164418 A1    11/2002    Fischer et al.
2007/0054810 A1*    3/2007    Kumakura .......... H01L 39/2487
                                                                505/433
2008/0274900 A1    11/2008    Shimoyama et al.

FOREIGN PATENT DOCUMENTS

JP    2003-217369 A        7/2003
JP    2003217369 A  *    7/2003
(Continued)

OTHER PUBLICATIONS

Shu Jun Ye et al., Strong enhancement of high-field critical current properties and irreversibility field of MgB2 superconducting wires by coronene active carbon source addition via the new B powder carbon-coating method, 2014 Supercond. Sci. Technol. 27 085012 (Year: 2014).*

(Continued)

*Primary Examiner* — Livius R. Cazan
(74) *Attorney, Agent, or Firm* — Mattingly & Malur, PC

(57) ABSTRACT

The present invention is intended to increase the critical current density of a wire rod having a shape with good symmetry such as a round wire or a square wire by making use of mechanical milling method. The production method of the present invention for the MgB$_2$ superconducting wire rod comprises a mixing process of preparing a powder by adding a solid organic compound to a magnesium powder and a boron powder and then applying an impact to the powder to prepare a mixture of the powder in which boron particles are dispersed inside magnesium particles, a filling process of filling a metal tube with the mixture, an elonga- (Continued)

tion process of elongating the metal tube filled with the mixture and a heat treatment process of heat-treating the metal tube to synthesize $MgB_2$.

5 Claims, 8 Drawing Sheets

(51) Int. Cl.
| | |
|---|---|
| *H01L 39/24* | (2006.01) |
| *G01R 33/3815* | (2006.01) |
| *H01F 6/06* | (2006.01) |
| *H01F 6/00* | (2006.01) |

(52) U.S. Cl.
CPC ............. *H01F 6/06* (2013.01); *H01L 39/141* (2013.01); *H01L 39/2487* (2013.01)

(58) Field of Classification Search
USPC .......................................................... 29/599
See application file for complete search history.

(56) References Cited

FOREIGN PATENT DOCUMENTS

| | | | | |
|---|---|---|---|---|
| JP | 2006-107841 | A | 4/2006 | |
| JP | 2006-127898 | A | 5/2006 | |
| JP | 2007-059261 | A | 3/2007 | |
| JP | 4259806 | B2 | 4/2009 | |
| JP | 2012-014912 | A | 1/2012 | |
| WO | WO-2007147219 | A1 * | 12/2007 | ........... C04B 35/636 |
| WO | 2015/087387 | A1 | 6/2015 | |
| WO | 2015/093475 | A1 | 6/2015 | |
| WO | WO-2015093475 | A1 * | 6/2015 | ......... H01L 39/2487 |

OTHER PUBLICATIONS

Teruo Matsushita, et al., Essential factors for the critical current density in superconducting MgB2: Connectivity and flux pinning by grain boundaries, Superconductor Science and Technology, 21, Nov. 27, 2007, 015008 (7pp).

Akiyasu Yamamoto, et al., Towards the Realization of Higher Connectivity in MgB2 Conductors: In-Situ or Sintered Ex-situ?, Japanese Journal of Applied Physics 51 (2012) 010105.

Masaya Takahashi, et al., The influence of magnesium grain size and ball milling time on the phase formation of MgB2 tapes, Superconductor Science and Technology, 22, Oct. 23, 2009, 125017 (7pp).

Marko Herrmann, et al., Touching the properties of NbTi by carbon doped tapes with mechanically alloyed MgB2, Applied Physics Letters 91, 082507 (2007).

W Häbler, et al., Anisotropy of the critical current in MgB2 tapes made of high energy milled precursor power, Superconductor Science and Technology 23, May 4, 2010, 065011 (6pp).

Shunsuke Mizutani, et al., Self-sintering-assisted high intergranular connectivity in ball-milled ex situ MgB2 bulks, Superconductor Sciences and Technology 27, Sep. 3, 2014, 114001 (8pp).

International Search Report of PCT/JP2017/009648 dated Apr. 25, 2017.

M A Susner, et al., "Drawing induced texture and the evolution of superconductive properties with heat treatment time in powder-in-tube in situ processed MgB2 strands", Supercond. Sci. Technol. 25 (2012) 065002 (13pp).

Japanese Office Action received in corresponding Japanese Application No. 2018-511933 dated Nov. 17, 2020.

* cited by examiner

| | Secondary Electron Image | Back-scattered Electron Image |
|---|---|---|
| MM Before heat-treated |  |  |
| MM 600°C 3h |  |  |
| MM-CR Before heat-treated |  |  |
| MM-CR 600°C 3h |  |  |

| | Secondary Electron Image | Back-scattered Electron Image |
|---|---|---|
| MMCO-CR Before heat-treated | | |
| MMCO-CR 600°C 3h | | |
| MMST-CR 600°C 3h | | |

(a) Wire 1

(b) Wire 2

(c) Wire 3

PRODUCTION METHOD FOR MGB$_2$ SUPERCONDUCTING WIRE ROD SUPERCONDUCTING COIL AND MRI

FIELD OF THE INVENTION

The present invention relates to a production method for an MgB$_2$ superconducting wire rod that has a excellent critical current property.

DESCRIPTION OF THE RELATED ART

Since MgB$_2$ has a highest critical temperature of approximate 40 K among metallic superconductors, MgB$_2$ is expected to be applied to superconducting wire rods and superconducting magnets.

A commonly used production method of the superconducting wire rod is Powder In Tube (PIT) method. According to PIT method, a metal tube is filled with a powder that is used as a starting material, the tube is elongated through such processes as drawing processes and a single core wire rod (wire rod having one superconducting filament) or a plural core wire rod (wire rod having plural superconducting filaments) is produced of the elongated tube.

A production method making use of an MgB$_2$ powder as a starting material is referred to as the ex situ method. A production method making use of a mixture of a magnesium powder and a boron powder is referred to as the in situ method.

When a superconducting wire rod is used, it is preferable for the superconducting wire rod that is used to have a high critical current density. The critical current density is defined as a maximum current density up to which the current flows with zero resistance. The critical current density of the superconductor is determined by magnetic flux pinning phenomena. In the case of type 2 quantized superconductors, magnetic flux lines come into a sample and the magnetic flux lines receive a Lorenz force when the current is flowing. Then if the magnetic flux lines move, a resistance loss is caused. Therefore it is necessary to introduce a defect or an inhomogeneous portion into the sample.

In the case of MgB$_2$ the pinning of the magnetic flux line occurs at crystal boundaries. The magnetic flux pinning is enhanced by suppressing crystallinity and making crystal grains smaller. When MgB$_2$ is synthesized at a temperature equal to or higher than 800° C., the crystallinity is enhanced and crystal grains become larger. Thus it is effective to synthesize it at a temperature equal to or lower than 700° C. in light of the magnetic flux pinning (See Non-patent document 1). Making use of the ex situ method, the superconducting current flows through MgB$_2$ particles that are in contact one another without being heat-treated. However, the critical current density becomes higher by sintering MgB$_2$ particles. Sintering MgB$_2$ particles requires heating between 800° C. and 900° C. As is explained, the heating at as high a temperature as this temperature is not preferable for the magnetic flux pinning (Non-Patent document 2). According to the in situ method, a heat treatment is carried out to have magnesium and boron react with each other to synthesize MgB$_2$ after the elongation process. If this heat treatment is carried out at a temperature equal to or lower than 700° C., MgB$_2$ is synthesized sufficiently and a grain structure with a high magnetic flux pinning force is formed. However, since the reaction in which Magnesium and Boron react with each other to synthesize MgB$_2$ is a volume reduction reaction, this method has a shortcoming of the lower packing factor. In general, MgB$_2$ is synthesized by magnesium particles as a staring material, whose size is several tens of micro meters, diffusing into boron particles, which leads to formation of pores as large as several tens of micro meters resulting in the lower packing factor (See Non-Patent document 2).

Each of the ex situ method and the in situ method is an exemplary production method of PIT method, has its own shortcoming and is not necessarily the best method. On the other hand, there have been attempts to enhance reactivity of the magnesium powder and the boron powder by mixing them with a planetary ball milling apparatus. Hereinafter this method is referred to as the mechanical alloying method or the mechanical milling method. There have been reports that higher critical current densities are obtained with MgB$_2$ synthesized with the mixed powder of magnesium and boron in which MgB$_2$ is partially synthesized before a heat treatment to be performed (For example, Non-Patent documents 3, 4, 5 and Patent document 1).

PRIOR ART DOCUMENTS

Patent Document

Patent document 1: JP4259806B2

Non-Patent Documents

Non-Patent document 1: Supercond. Sci. Technol. 21 (2008) 015008
Non-Patent document 2: Jpn. J. Appl. Phys. 51 (2012) 010105
Non-Patent document 3: Supercond. Sci. Technol. 22 (2009) 125017
Non-Patent document 4: Appl. Phys. Lett. 91 (2007) 082507
Non-Patent document 5: Supercond. Sci. Technol. 23 (2010) 065001
Non-Patent document 6: Supercond. Sci. Technol. 27 (2014) 114001

OBJECTIVE TO BE ACHIEVED BY THE INVENTION

Most of the reports on the mechanical milling method are related to the tape. There are several reports found on round wires of the mechanical milling method, their critical current densities are not so high as expected. In the case of tapes, the critical current density varies significantly depending on an angle of the tape face relative to the external magnetic field (See Non-Patent document 5).

For such applications as Magnetic Resonance Imaging (MRI) for which the generated magnetic field needs to be homogeneous, wires having a cross section in such a symmetrical shape as round or square are preferably adopted. It is difficult to ensure that the wound wire of the tape has a sufficiently good size accuracy. In addition, using such wire rods as have the critical current density dependent on the direction of the magnetic field causes restriction on the design of the wound wire.

The present invention is intended to increase the critical current density of round or square shaped wire that has good symmetry by making use of mechanical milling method.

SUMMARY OF THE INVENTION

The production method for a superconducting wire rod of the present invention comprises a mixing process of adding a solid organic compound to a magnesium powder and a boron powder and subsequently applying an impact on the magnesium powder and the boron powder to produce a mixture in which boron particles are dispersed inside magnesium particles, a filling process of filling a metal tube with the mixture, an elongation process of elongating the metal tube filled with the mixture into a wire rod and a heat treatment process of heat-treating the wire rod for synthesizing $MgB_2$.

Effect of the Invention the present invention is able to make the critical current density of such a wire rod as a round or square wire having a good symmetry higher.

DETAILED DESCRIPTION OF THE INVENTION

Figure 1:
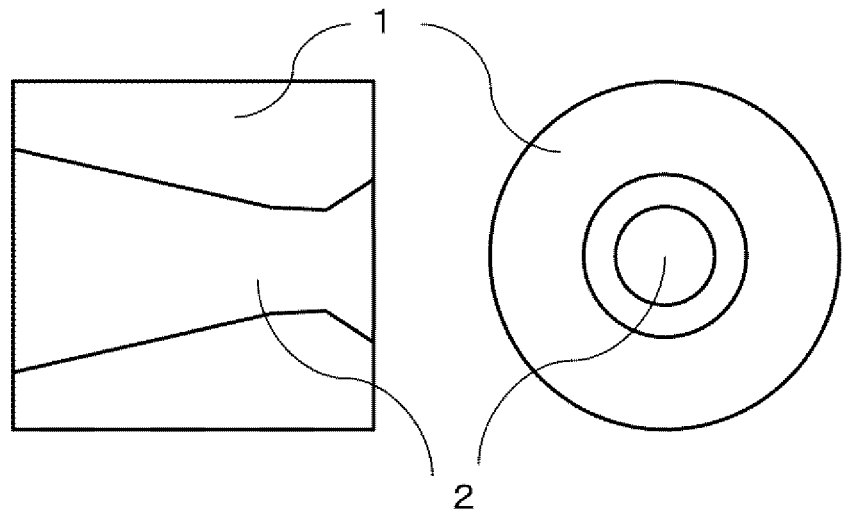
FIG. 1 schematically shows a die used for a drawing process.

Hereinafter embodiments of the present invention are explained with reference to the drawings.

According to the present invention, an $MgB_2$ wire rod is produced the following way. A magnesium powder, a boron powder and a solid organic compound are weighed to collect these materials in a predetermined weight ratio. Examples of the solid organic material are an aromatic hydrocarbon, an organic acid and a metal salt of the organic acid. An addition amount of the solid organic compound should be less than an amount of the solid organic compound that contains an amount of carbon being equal to 7.5 at % of an amount of boron in the weighed boron powder. All powders are mixed while an impact is being applied to them to have the boron particles dispersed inside the magnesium particles. This mixing should be finished in such a way that $MgB_2$ is not formed distinctively (Peaks of $MgB_2$ are not distinctively confirmed in the powder X-ray diffraction analysis). One example of the mixing method is a mixing process with a planetary ball milling, in which balls apply an impact on the powders. A metal tube is filled with the mixture and elongated into a wire rod. The elongation process ought to include a working process in which the wire rod is elongated with a working jig having a portion in direct contact with the wire rod that is not fixed and held rotatable. One example of this type of the working process is a cassette rolling process. Alternatively a warm working process in a temperature range between 150 and 500° C. may be used for a part of the process.

A longitudinal direction cross section of the $MgB_2$ wire rod that is produced through the process above mentioned shows the following features. Pores in the $MgB_2$ filament whose size is larger than 5 μm occupy an area equal to or smaller than 5% of the cross section area. A median diameter of a pore size distribution on the number of pores having circle equivalent diameters larger than 20 μm is smaller than 100 μm.

A plural core wire includes $MgB_2$ filaments and a barrier layer of iron, niobium, tantalum or titanium disposed around each of $MgB_2$ filaments. All of the $MgB_2$ filaments are joined through the barrier layer. The plural core wire further includes an outermost layer of a material having a hardness higher than pure copper does and an intermediate layer of pure copper disposed inside the outermost layer and off the $MgB_2$ filaments. The plural core filament having this configuration can be produced as a wire rod having a homogeneous cross section.

Example 1

Table 1 indicates a specification of produced examples. As starting materials were used a magnesium powder with a particle size of 200 mesh and a purity >99.9% and an amorphous boron powder with a particle size <250 nm and a purity >98.5%.

A solid organic compound was added to part of samples. The organic compounds for the addition were coronene ($C_{24}H_{12}$) with a purity >83% and stearic acid ($C_{18}H_{36}O_2$) with a purity >99%. The magnesium, the boron and the organic compound were weighed to have a atomic composition ratio, Mg:B:C of 1:2 (1·x):2x.

A couple of mixing methods, "ordinary" and "mechanical milling", were used and one of them was used for each of the samples depending on the sample. "ordinary" indicates that raw material powders were put into a plastic vessel together with stainless balls having a diameter of 10 mm, the plastic vessel was sealed and the powders were mixed on a pot-mill apparatus. "mechanical milling" indicates that 7 gram of the raw material powders are put into a zirconia vessel having a volume capacity of 80 ml together with 30 zirconia balls having a diameter of 10 mm, the zirconia vessel is sealed and the powders are mixed with a planetary ball mill apparatus at a rotation speed 400 rpm for 6 hours.

Figure 2:
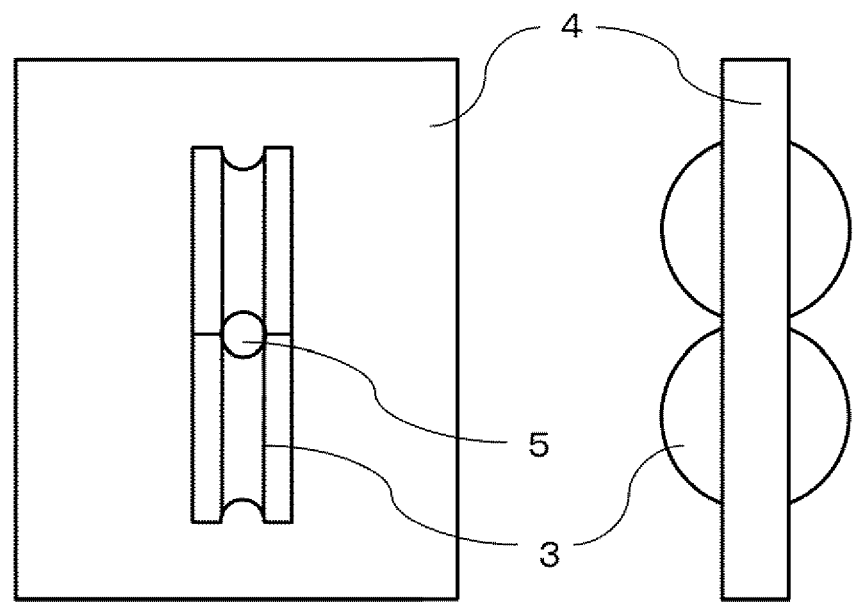
FIG. 2 schematically shows a die used for a cassette rolling process.

The mixture was filled into a steel tube having an inner diameter of 13.5 mm and an outer diameter of 18.0 mm and the steel tube was elongated. The elongation process included either only a drawing process or both a drawing process and a cassette rolling process, depending on the sample. When both the drawing process and the cassette rolling process were carried out, the steel tube was drawn up to the diameter of 0.8 mm and then further cassette-rolled. As shown in FIG. 1, the drawing process is a working process in which a sample is drawn through a tapered hole bored through a die to be elongated. The drawing process is repeated changing a die to another one that has a thinner hole so that the diameter of the sample is gradually made smaller. As shown in FIG. 2, the cassette rolling process is a working process in which a sample is drawn through between grooves that are formed on rolls attached to a box to be elongated. As the rolls are repeatedly changed to those having smaller grooves, the diameter of the metal tube is reduced to have the metal tube elongated. When the drawing process is carried out, the sample receives force applied by a die that is fixed. On the other hand, when the cassette rolling process is carried out, a sample receives force applied by rolls that are rotating.

Wire rods having a diameter of 0.5 mm were heat-treated in an argon atmosphere. The heat treatment conditions indicated in Table. 1 are optimized conditions so as to maximize the critical current density.

longitudinal direction of the wire rod is typical of the in the situ wire rod. As explained earlier, the lower packing factor due to this crystal grain structure is a problem with the in situ method. The sample INCO differs from the sample IN in that coronene $C_{24}H_{12}$ was added to INCO. Although there is not a significant difference in the grain structure between the sample INCO and the sample IN, the sample INCO has much higher $J_C$ than the sample IN. Therefore this improvement of $J_C$ is considered due to replacement effect with carbon atoms. When a carbon compound such as coronene is added, boron sites in $MgB_2$ crystal are replaced by carbon atoms. The carbon atoms that replace the boron sites function as lattice defects and shorten the mean free path of the electrons, which results in the upper critical magnetic field becoming higher and $J_C$ becoming higher especially in the high magnetic field.

Figure 5:
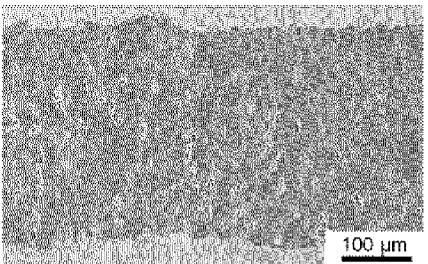
FIG. 5 shows scanning electron microscope photographs of longitudinal direction cross sections of single core wire rods produced through the mechanical milling method.
Figure 5:
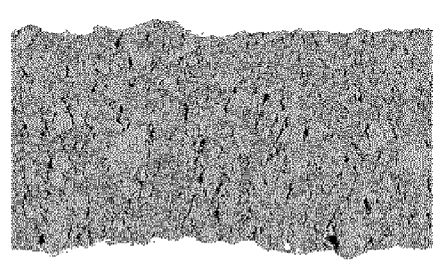
Figure 5:
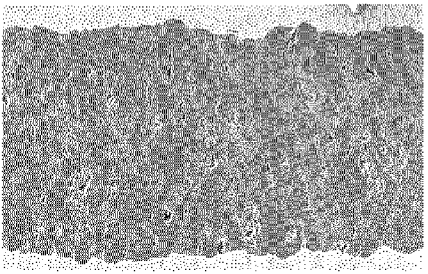
Figure 5:
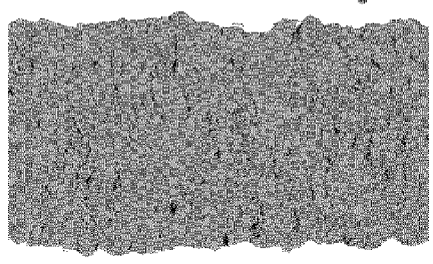
Figure 5:
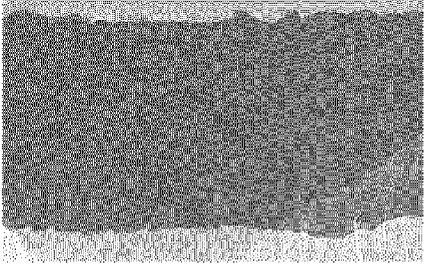
Figure 5:
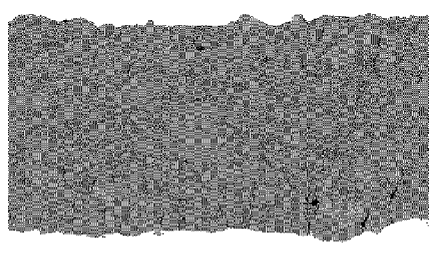
Figure 5:
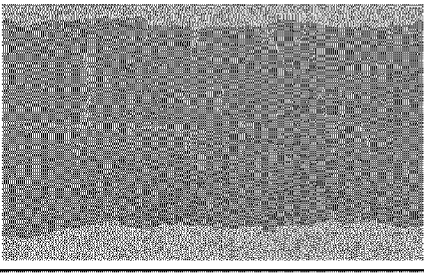
Figure 5:
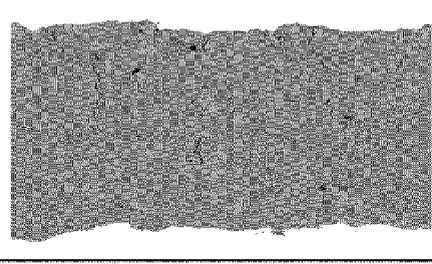

FIG. 5 shows SEM images of longitudinal direction cross sections of single core wire rods produced with the mechanical milling method. There is a pair of a secondary electron image and backscattered electron image of each of longitudinal direction cross sections of MM Before Heat-treatment

TABLE 1

| Sample | Additive | Addition Amount (at %) | Mixing | Elongation Method | Heat-Treatment |
|---|---|---|---|---|---|
| IN | Nothing | 0 | Ordinary | Drawing | 600° C. 3 h |
| INCO | $C_{24}H_{12}$ | 2 | Ordinary | Drawing | 600° C. 6 h |
| MM | Nothing | 0 | Mechanical Milling | Drawing | 600° C. 3 h |
| MM-CR | Nothing | 0 | Mechanical Milling | Drawing → Cassette Rolling | 600° C. 3 h |
| MMCO-CR [Example] | $C_{24}H_{12}$ | 2 | Mechanical Milling | Drawing → Cassette Rolling | 600° C. 3 h |
| MMST-CR [Example] | $C_{18}H_{36}O_2$ | 2 | Mechanical Milling | Drawing → Cassette Rolling | 600° C. 3 h |

Figure 3:
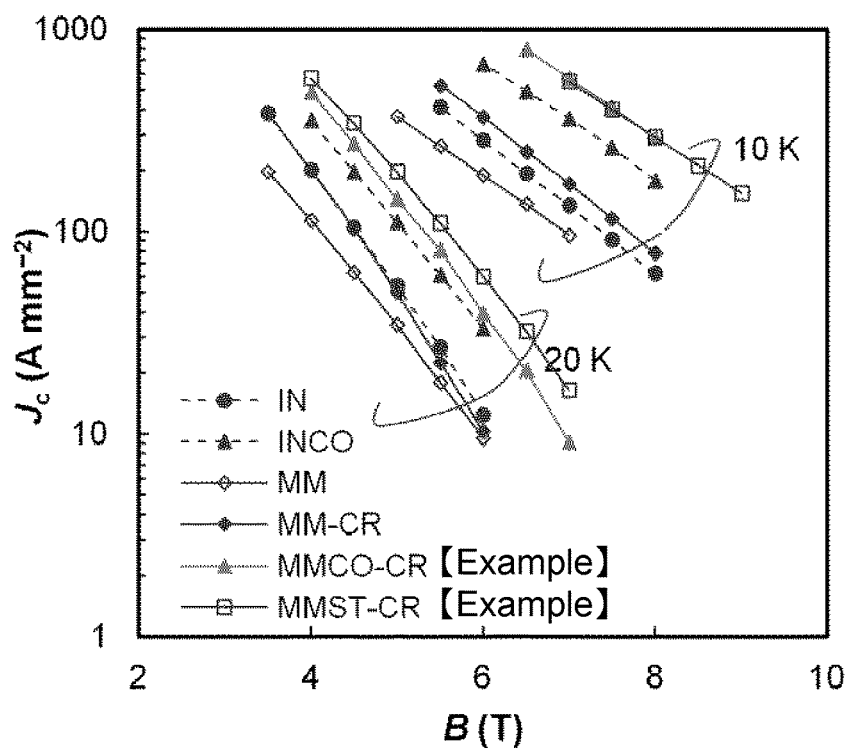
FIG. 3 indicates how dependent the critical current density of a produced single core wire rod is on a magnetic field.

FIG. 3 indicates how dependent the critical current density $J_C$ of each sample is on the magnetic field B. In the case of those samples with no additive (no solid organic compound added), a sample MM has the lowest $J_C$. A sample IN and a sample MM-CR have more or less the same $J_C$ at 20 K and the sample MM-CR has a higher $J_C$ at 10 K. The samples with any solid organic compound added have higher $J_C$. Especially a sample MMCO and a sample MMST·CR have significantly higher $J_C$.

Each sample was embedded in resin and a longitudinal direction cross section of the sample was made through dry polishing and a cross section polisher process and with a scanning electron microscope (SEM).

Figure 4:
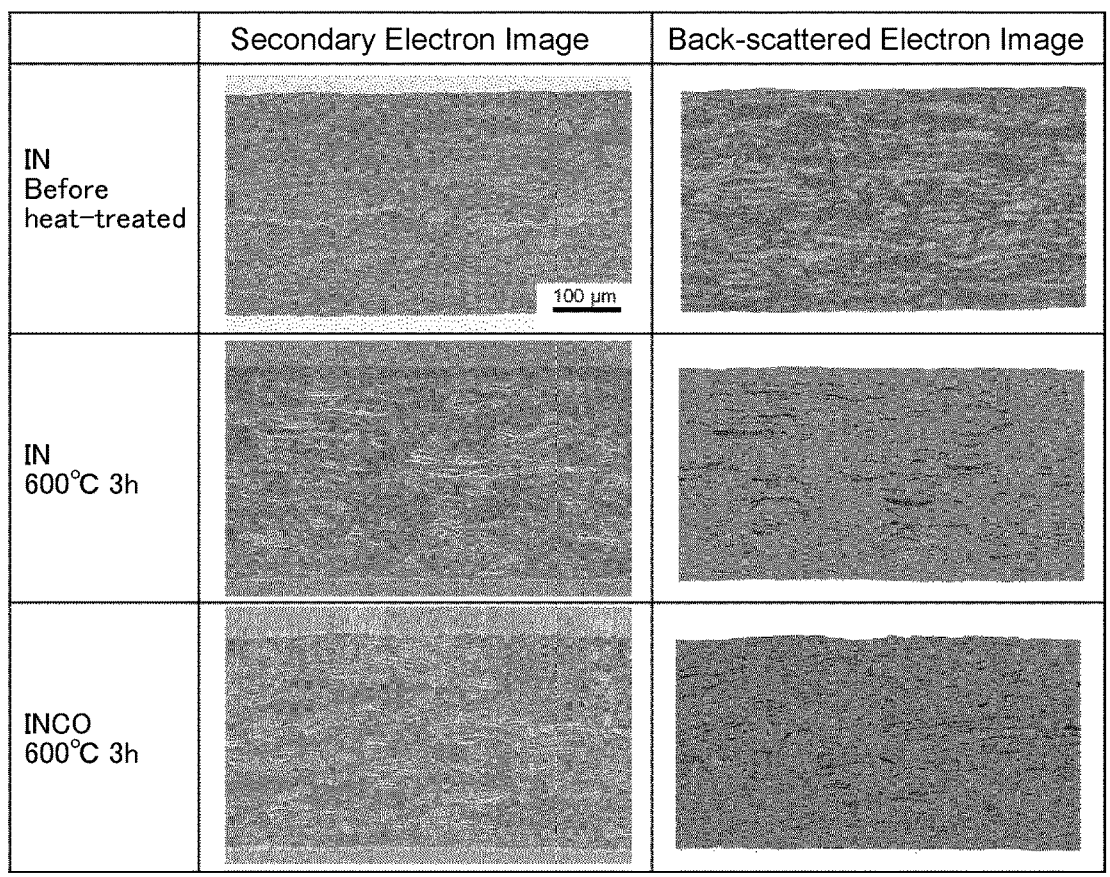
FIG. 4 shows scanning electron microscope photographs of longitudinal direction cross sections of single core wire rods produced through the in situ method.

FIG. 4 shows SEM images of longitudinal direction cross sections of single core wire rods produced with the situ method. There is a pair of a secondary electron image and a backscattered electron image of each of longitudinal direction cross sections of IN Before Heat-treatment (sample before heat-treated), IN600° C.3h (sample after heat-treated) and INCO600° C.6h (sample after heat-treated), which are shown in this order from the top. The secondary electron image shows an emphasized concavo-convex surface and the backscattered electron image emphasizes a composition and a density. The sample IN Before Heat-treatment has a light coloured portion indicating a region of magnesium particles and a dark coloured portion indicating a region of boron particles. Magnesium particles were elongated in the longitudinal direction of the wire rod through the drawing process. After this sample was heat-treated, pores were created where magnesium particles existed. A grain structure in which there exist a lot of pores that are elongated in the (sample before heat-treated), MM600° C.3h (sample after heat-treated), MM-CR Before Heat-treatment (sample before heat-treated) and MM·CR600° C.3h (sample after heat-treated), which are shown in this order from the top.

There are many pores perpendicular to the longitudinal direction of the wire rod in these samples. Looking at backscattered electron images of the samples before heat-treatment, each particle is recognized, since the boundaries of the powder particles are emphasized. Looking at the grain structure after heat-treated, it is noted that pores formed before heat-treated remain as they were. It is noted that the sample MM-CR has fewer pores than the sample MM does. The grain structure of the sample MM-CR before heat-treated suggests that powder particles were crushed to have gaps filled, which results in reduction of the pores. Accordingly it is noted that the cassette rolling process crushes the powder particles through the mechanical milling and has an effect of reducing the number of pores. However not all pores are completely gone from the sample MM-CR and there still remain relatively large pores, which could prevent the superconductive current from flowing freely.

Figures 6, 7:
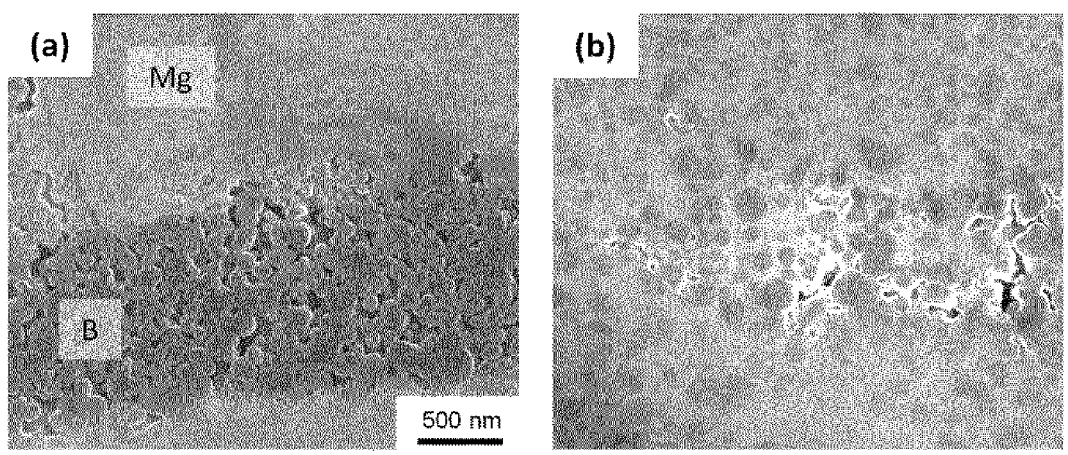
FIG. 6 shows scanning electron microscope photographs of longitudinal direction cross sections of single core wire rods produced with addition of a solid organic material and the mechanical milling method.
FIG. 7 shows high magnification scanning electron microscope photographs of a sample IN and a sample MMCO both before heat-treated.

FIG. 6 are SEM images of longitudinal direction cross sections of single core wire rods produced with addition of a solid organic compound and the mechanical milling method. FIG. 6 shows secondary electron images and backscattered electron images of longitudinal direction cross sections of the sample MMCO-CR (after heat-treated) and the sample MMST-CR. Looking at the sample MMCO-CR before heat-treated, there are scarcely pores seen compared with the sample MM-CR, since the powder particles in the mixture were elongated in the longitudinal direction of the wire rod. As a result, the sample MMCO-CR after heat-treated has a very dense grain structure. Similarly the sample MMST-CR has a very dense grain structure.

Then it is discussed how the grain structure of the wire rod with addition of a solid organic compound and through the mechanical milling becomes dense. View (a) in FIG. 7 is a high magnification secondary electron image of the longitudinal direction cross section of the sample IN and view (b) in FIG. 7 is a high magnification secondary electron image of the longitudinal direction cross section of the sample MMCO-CR. It is noted that in the sample IN there exist a region of magnesium particles that have been elongated with the elongation process and a region of fine boron particles that have gathered. Since boron particles are so hard as not to be deformed, there always exist pores in the region of the gathered boron particles and the packing factor cannot reach 100% in principle. On the other hand, the sample MMCO-CR has a grain structure where boron particles are dispersed in the magnesium matrix due to the mixing process with the planetary ball milling. Since real densities of Mg, B and $MgB_2$ are respectively 1.74, 2.36, 2.62 $g/cm^3$, a volume reduction of 24% occurs when $MgB_2$ is synthesized through the heat treatment. However the higher packing factor after the heat treatment is achieved through the mechanical milling method that achieves a higher packing factor before the heat treatment.

Figure 8:
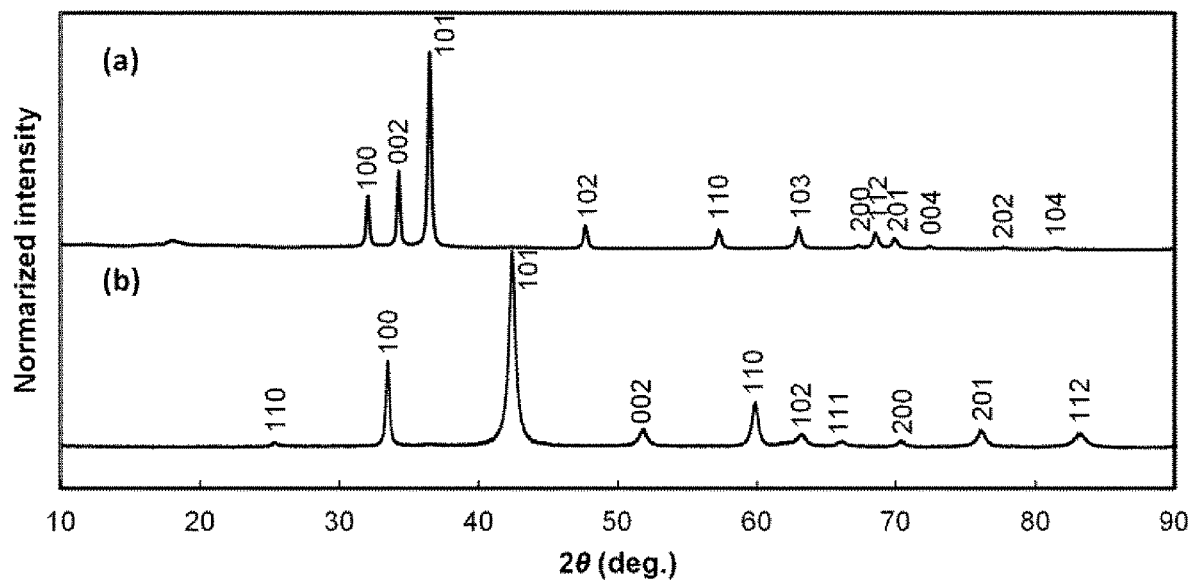
FIG. 8 shows a powder X-ray diffraction profile.

FIG. 8 shows powder X-ray diffraction profiles. View (a) in FIG. 8 shows an X-ray diffraction profile for the filling powder of the sample MMCO and index numbers attached to peaks correspond to what magnesium should have and most peaks are identified for magnesium. View (b) in FIG. 8 shows an X-ray diffraction profile for $MgB_2$ powder extracted from the sample IN. Index numbers attached to peaks correspond to what $MgB_2$ should have. As is understood from comparison between view (a) and view (b) in FIG. 8, no $MgB_2$ phase is confirmed from the filling powder of the sample MMCO. Accordingly it should be considered that $MgB_2$ is not synthesized while mixing is under way with the planetary ball mill apparatus, which is not in agreement with the production method described in Non-Patent document 4.

On the other hand, particles in the filling powder that are produced through the mechanical milling and have magnesium matrix in which boron is dispersed are more difficult to be deformed than pure magnesium. Therefore, there remains a gap between adjacent particles, as is seen in the sample MM. When the cassette rolling process is carried out in addition to the drawing process, it is possible to fill this gap to a certain extent by performing the cassette rolling process in addition to the drawing process and these processes are not necessarily enough. Then, if a solid organic compound is added to the filling powders, which are inherently hardly deformed, they can be elongated in the longitudinal direction of the wire rod, which results in the grain structure becoming denser. Therefore, adding the solid organic compound in the mechanical milling method has not only an effect of the replacement with carbon atoms, but also an effect of making the grain structure dense. Thus $J_C$, which is higher than what can be obtained through the in situ method, can be achieved.

Example 2

Although the cassette rolling process is used in Example 1, other processes may be used in order to enhance deformation of the filling powders prepared through the mechanical milling process. The way force is applied from working jigs to a sample in the cassette rolling process is more similar to that in the rolling process. For example, a similar effect is expected of a working method where a metal tube filled with a mixed powder is drawn through between plural working jigs that are rotating such as grooved rolls to reduce the diameter of the metal tube, the working jigs having a surface that is not fixed and to get in contact with the metal tube. On the other hand, a warm working process can be applied. Since magnesium that constitutes a matrix of the filling powder has a hexagonal close-packed crystal structure which in principle has a bottom plane functioning as only a slip plane that contributes to plastic deformation, it is considered difficult to work magnesium. However when magnesium is heated to a temperature equal to or higher than 150° C., other slip planes contribute to plastic deformation and magnesium can be worked more easily. It should be noted that the heating temperature ought to be lower than a temperature at which $MgB_2$ is synthesized, for example, not higher than 500° C.

Example 3

It is not clear which kind of solid organic compounds is most effective. However it has been confirmed that a hydrocarbon such as coronene, an organic acid such as stearic acid and a metal salt of organic acid have an effect of close-packing the grain structure.

According to evaluation of the work rods that were produced on the critical current density, the organic acid and the metal salt of organic acid turn out better than the hydrocarbon.

Example 4

The dependence of the critical current density on the temperature and the magnetic field changes with an amount of the solid organic compound added varying. Thus it is necessary to determine the appropriate amount of the added solid organic compound according to the temperature and the magnetic field in the environment used. This is due to the variation in the replacement rate of the boron sites with carbon atoms. On the other hand, it is not preferable to add a large amount of the solid organic compound in order to close-pack the grain structure. Having examined how the addition amount of coronene and stearic acid influences the grain structure, it was found that the ratio of an amount of carbon to be added to an amount of boron is preferably equal to or higher than 0.1 at % and lower than 7.5 at % and more preferably equal to or higher than 1.0 at % and equal to or lower than 3.0 at % and that if the amount of carbon corresponding to the ratio equal to or higher than 7.5 at % of the amount of boron is added, the grain structure in which boron particles are dispersed inside magnesium particles cannot be formed. The process in which boron is introduced in magnesium particles occurs when magnesium particles are crushed and bound together repeatedly while mixing with the planetary ball milling is under way. If too large an amount of the solid organic compound is added, the surfaces of the magnesium particles are covered with the solid organic compound, which prevents the magnesium particles from binding together, boron cannot be introduced into the magnesium particles. Similarly if a liquid organic compound is added, the magnesium particles is prevented from binding together, the grain structure in which boron is dispersed inside the magnesium particles cannot be formed. Therefore the addition amount of the solid organic compound is preferably not higher than 7.5 at % of the amount of boron.

If more carbon atoms for the replacement are added, other type of additives such as metal carbon compounds should be used in addition to the solid organic compound.

Example 5

$MgB_2$ filaments of the $MgB_2$ superconducting wire rods of the present invention have a distinctive grain structure. First of all, there exist no large pores. An area percentage of pores having lengths larger 10 μm in an $MgB_2$ filament is equal to or less than 5%. The length of a pore is defined as a maximum length among the lengths of line segments each of which connects between arbitrarily selected two points on the peripheral line of the pore. It is not possible to produce so close-packed grain structure as this through the ordinary in situ method.

Figure 9:
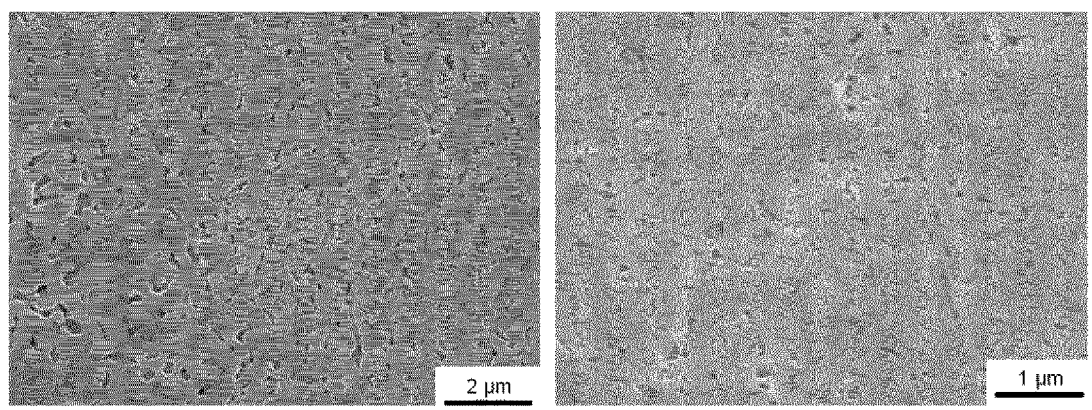
FIG. 9 shows high magnification scanning electron microscope photographs of an ex situ wire rod and the sample MMCO.
Figure 10:
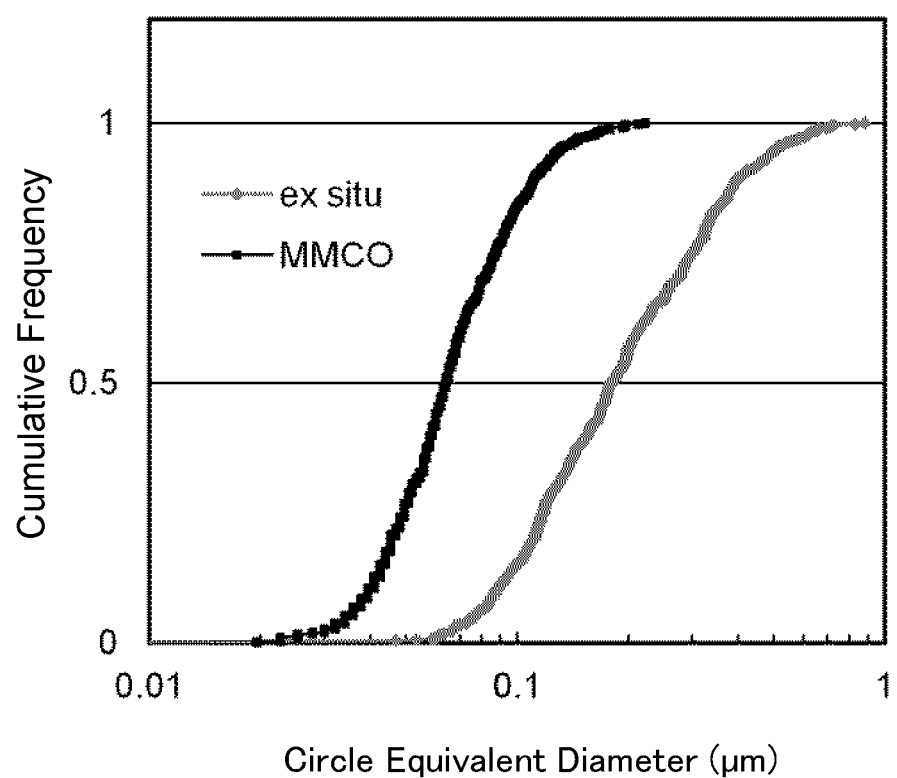
FIG. 10 indicates cumulative pore size distribution on the number of pores with respect to the circle equivalent diameters of the pores for an ex situ wire rod and the sample MMCO.

Although wire rods produced through the ex situ method has a feature that there are less large pores (See Non-Patent document 2), there is a difference in the high magnification grain structure between MMCO-CR and the ex situ method. In FIG. 9, a comparison is made on the high magnification grain structure between the sample MMCO-CR (left) and a single core ex situ wire rod (right) produced for the comparison. Looking at the sample MMCO-CR, it has pores seen much smaller than those seen in the ex situ wire rod. FIG. 10 shows a pore size distribution on the number of pores with respect to the circle equivalent diameters of the pores. Pores smaller than 20 nm are not included in this distribution because it is difficult to identify them with SEM and only those pores larger than 20 nm are included. The median diameter of the distribution of MMCO-CR is approximately 60 nm while the median diameter of the distribution of the ex situ wire rod is approximately 200 nm. The reason why there is a difference in the pore size is as follows. In the case of MMCO-CR, since $MgB_2$ is synthesized as magnesium reacts with boron into boron particles, gaps between boron particles, which exist before the synthesis, are left as pores after the synthesis. The particle size of boron particles used for $MgB_2$ synthesis is usually about 100 nm. Accordingly the pores become small. On the other hand, since $MgB_2$ particles are sintered in the ex situ method, gaps between $MgB_2$ particles are left as pores. The $MgB_2$ powder is usually milled to a finer powder after the powder is synthesized. However if $MgB_2$ particles is milled, the particle size of the $MgB_2$ particles can be made smaller to about 1 μm and cannot be made further smaller, no matter how intensively milled (See Non-Patent document 6). As a result, pores in the ex situ wire rod are larger than those in MMCO-CR.

Plural core wire rods of various materials have been produced. A metal tube having an inner diameter of 13 mm and an outer diameter of 18 mm was provided and filled with the powder prepared the same way as for the sample MMCO-CR. The filled metal tube was elongated through the drawing process to the outer diameter of 12 mm and drawn through a hexagonal die to a wire rod having a hexagonal cross section having opposite sides with a length of 10.2 mm. A metal tube is inserted outside the hexagonal wire rods and a metal bar was inserted in the metal tube and disposed at the center of the metal tube. This combined wire rod was elongated through the cassette-rolling process after the drawing process to the outer diameter of 1.5 mm.

Figure 11:
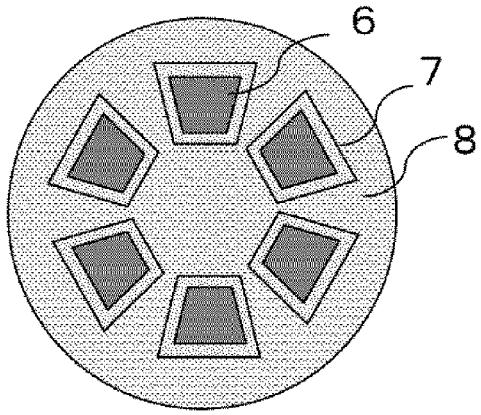
FIG. 11 shows cross section configurations of wires 1, 2, 3.
Figure 11:
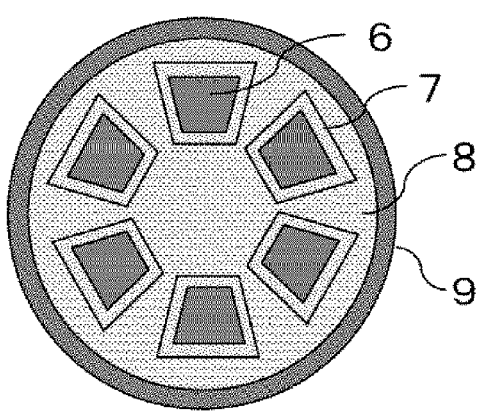
Figure 11:
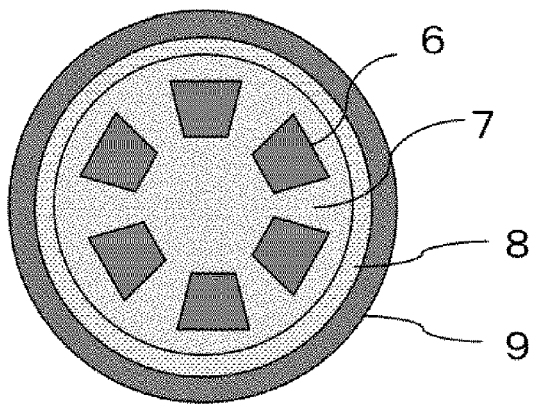
Figure 12:
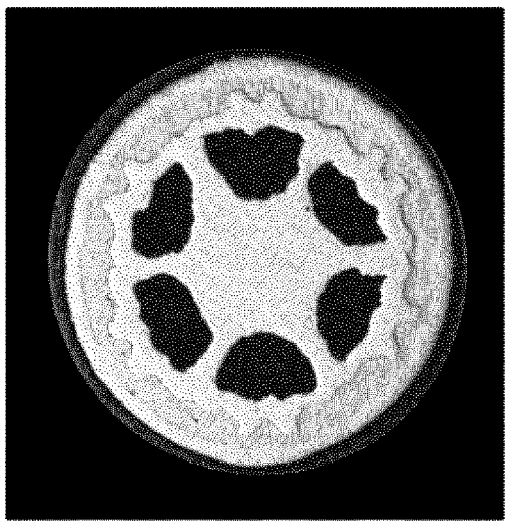
FIG. 12 shows a lateral direction cross section of wire 3.

Table. 2 indicates combinations of materials of the powder filled tube, the outer cover tube and the center bar. If all processes proceed ideally, the cross section configurations as shown in FIG. 11 are obtained. In the case of Wire 1, the iron layer enclosing the filaments broke at many points during the working process after combined and the filaments have irregular shapes. The iron layer was broken in Wire 2 as well and the iron layer was damaged more in Wire 1. Wire 3 has a cross section that is similar to shown in FIG. 11. The actual cross section of Wire 3 is shown in FIG. 12.

TABLE 2

| Sample | Powder Filled Tube | Outer Cover Tube | Center Bar |
|---|---|---|---|
| Wire 1 | Cu/Fe | Cu | Cu |
| Wire 2 | Cu/Fe | Monel Metal | Cu |
| Wire 3 | Fe | Monel Metal/Fe | Fe |

There is a case in which the filling powder that is milled through the mechanical milling method is so hard that it breaks the iron layer during the elongation process. However, when the cross section with all filaments joined through iron like Wire 3 is made, a risk of the iron layer being broken is significantly reduced. Whatever material that substantially does not react with Mg may be used for a material to be in contact with $MgB_2$ and such a metal as niobium, tantalum or titanium as well as iron will do.

As for the outer cover layer, if such a relatively soft material as copper is used, the filament is likely to have an irregular shape after the elongation process. Thus it is effective to use such a high strength metal as Monel® metal (a group of nickel alloys, primarily composed of nickel (from 52 to 67%) and copper, with small amounts of iron, manganese, carbon, and silicon). Other than Monel® metal, niobium, cupronickel and iron may be used.

The examples that are shown are prepared with six filaments. However if there are at least a couple of filaments included in the wire rod, it may be called a plural core wire and include more than six filaments. Plural filaments may be arranged on plural concentric circles.

Figure 13A:
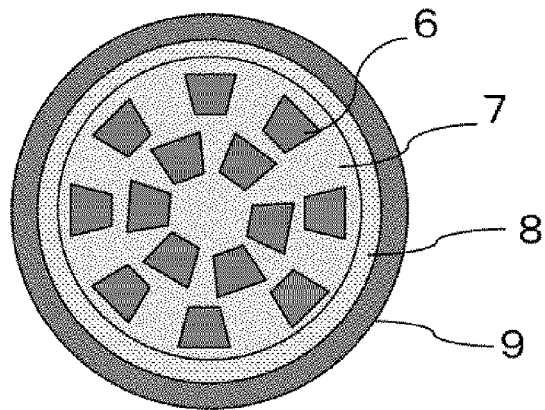
FIGS. 13A and 13B shows a different cross sections configuration of a plural core wire, (a) in the case of many filaments and (b) in the case of copper disposed at the center of the wire.
Figure 13B:
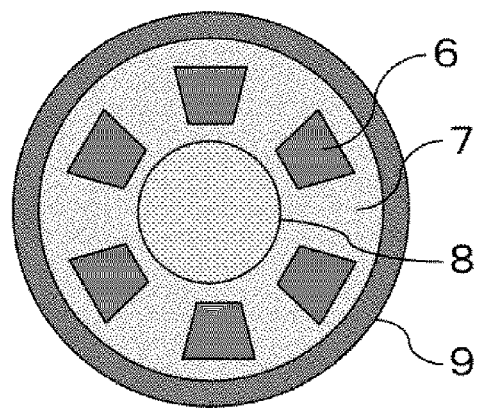

In order to keep the superconducting wire thermally stable, it often has a cross section configuration inclusive of pure copper. Pure copper may be disposed inside and on the outer cover layer as shown in FIG. 11 or at the center of the wire rod as shown in FIG. 13B.

Example 7

This example explains a couple of methods with which a superconducting coil is produced of a superconducting wire rod of the present invention.

The first method is Wind & React method and a superconducting wire rod is wound about a bobbin and then heat-treated, if need be. Since a magnetization speed by the coil cannot be increased if the wound superconducting wire rod is short-circuited in-between, the superconducting wire rod should be preferably covered with an insulation material. Such a heat-withstanding material as glass fiber may be used for the insulation material because of the subsequent heat treatment in Wind & React method. After heat-treated, the superconducting wire rod that is heat-treated is impregnated with resin to be fixed, if need be.

The second method is React & Wind method and a superconducting wire rod is wound about a bobbin after it is heat-treated. In this method, the superconducting wire rod is covered with the insulation material after it is heat-treated. Accordingly a material such as enamel that is not capable of withstanding high temperatures may be used for the insulation material. The superconducting wire rod is impregnated with resin to be fixed after it is wound about the bobbin.

Example 8

Figure 14:
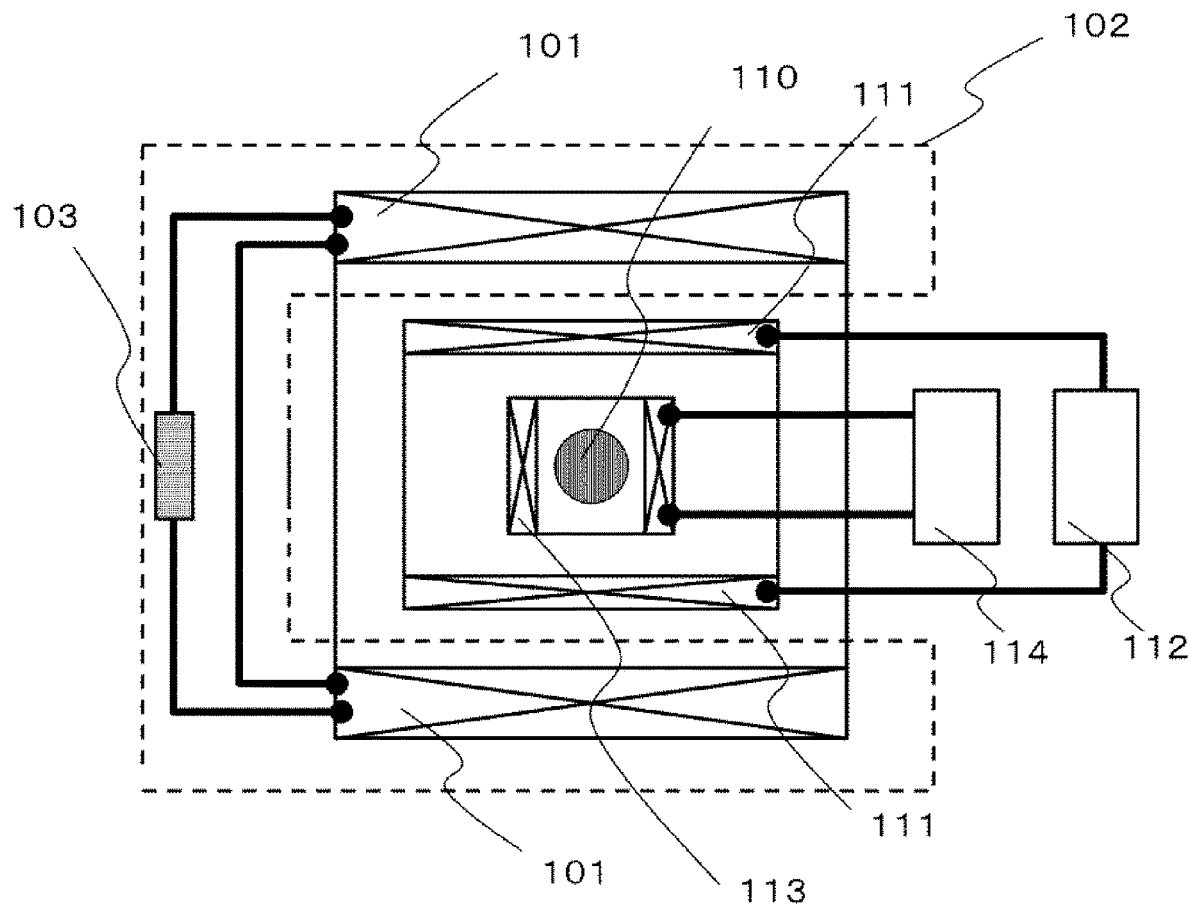
FIG. 14 indicates a configuration of a MRI apparatus.

This example explains a configuration of MRI making use of the superconducting wire rod of the present invention. FIG. 14 shows a configuration of the MRI. The superconducting coil of the superconducting wire rod is housed in a cryostat 102 together with a permanent current switch and cooled by a refrigerant and a refrigerator. An electrical current flowing through a circuit consisting of the superconducting coil 101 and the permanent current switch 103 generates a stable static magnetic field with respect to time at a position where an object for measurements is. The higher the static magnetic field, the higher the nuclear magnetic resonance frequency is and the better the frequency resolution is. If need be, a dynamically changing electrical current is supplied to an inclined magnetic field coil 111 from an amplifier for inclined magnetic field 112 to generate at the position of the object of measurement 110 a magnetic field that has a spatial distribution. In addition, while a vibrating magnetic field is applied to the object of measurement by making use of a RF (Radio Frequency) antenna 113 and a RF transceiver 114, a resonance signal emitted from the object of measurement is received, which enables tomographic image diagnosis on the object of measurement.

The superconducting wire rod of the present invention has a cross section in such a shape as a circle or a square, which does not restrict the design of the superconducting apparatus and is easily used, and has a higher current density. The superconducting apparatus of the present invention can operate at higher cooling temperatures because of the higher critical current density of its superconducting wire rod. Accordingly the amount of helium and the electricity cost for operating the refrigerator for cooling is reduced.

DESCRIPTION OF SIGNS

1: Die, 2: Hole, 3: Roll, 4: Roll fixing jig, 5: Groove, 6: Filament, 7: Barrier material, 8: Copper, 9: Outer cover material, 101: Superconducting coil, 102: Cryostat, 103: Permanent current switch, 110: Object of measurement, 111: Inclined magnetic field coil, 112: Amplifier for inclined magnetic field, 113: RF antenna, 114: RF transceiver

The invention claimed is:

1. A production method for an $MgB_2$ superconducting wire rod having a plurality of $MgB_2$ filaments, the production method comprising:
   a mixing process of preparing a filling powder by adding a solid organic compound in a solid state to a magnesium powder and a boron powder and then, after the solid organic compound is added to the magnesium powder and boron powder, applying an impact to the filling powder to prepare a mixture of the filling powder in which boron particles are dispersed inside magnesium particles,
   a filling process of filling a metal tube with the mixture of the filling powder,
   an elongation process of elongating the metal tube filled with the mixture into a wire rod, the elongation process including a drawing process of drawing the mixture through a plurality of dies and a rolling process of causing the mixture to pass through gaps between rotating rolls after the drawing process to make the diameter of the metal tube smaller; and
   a heat treatment process of heat-treating the wire rod to synthesize $MgB_2$ to form the $MgB_2$ filaments,
   wherein a ratio of carbon to boron in the mixture is greater than or equal to 0.1% and less than 7.5% after the solid organic compound is added,
   wherein an area percentage of pores, in the $MgB_2$ filaments of the $MgB_2$ superconducting wire rod, having lengths longer than 10 μm and occupying a cross section area is equal to or less than 5% of the cross-sectional area of the $MgB_2$ filaments, and
   wherein a method of applying the impact to the powder in the mixing process is a mechanical milling method.

2. The production method for an $MgB_2$ superconducting wire rod as described in claim 1, wherein the solid organic compound is a hydrocarbon, an organic acid or a metal salt of an organic acid.

3. The production method for an $MgB_2$ superconducting wire rod as described in claim 1, wherein the diameter of the metal tube is reduced while the metal tube is kept heated between 150° C. and 500° C.

4. The production method for an $MgB_2$ superconducting wire rod as described in claim 1, wherein after being drawn through the first die, the metal tube filled with the mixture is made to pass through the gap between rotating rolls after being drawn through a second die in which a second tapered hole is bored and having a narrower diameter than the first tapered hole of the first die, so that a diameter of the metal tube is gradually made even smaller in the elongation process.

5. The production method for an $MgB_2$ superconducting wire rod as described in claim 1, wherein the ratio of carbon to boron in the mixture is greater than or equal to 1% and less than 3% after the solid organic compound is added.

* * * * *